(12) United States Patent
Morita et al.

(10) Patent No.: US 6,957,475 B2
(45) Date of Patent: Oct. 25, 2005

(54) METHOD OF MANUFACTURING PIEZOELECTRIC COMPONENT

(75) Inventors: Koji Morita, Omihachiman (JP); Masanobu Sugimori, Toyama-ken (JP); Muneyuki Daidai, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 393 days.

(21) Appl. No.: 10/036,599

(22) Filed: Nov. 9, 2001

(65) Prior Publication Data

US 2002/0089263 A1 Jul. 11, 2002

Related U.S. Application Data

(62) Division of application No. 09/412,204, filed on Oct. 5, 1999, now Pat. No. 6,344,706.

(30) Foreign Application Priority Data

Oct. 20, 1998 (JP) ............................................. 10-297684
Jul. 9, 1999 (JP) ............................................. 11-195237

(51) Int. Cl.$^7$ ............................ H04R 17/10; H05K 3/28
(52) U.S. Cl. ......................... 29/25.35; 29/841; 29/855; 427/100
(58) Field of Search ................................ 29/25.35, 841, 29/855; 310/320, 340, 345, 348, 366; 427/100

(56) References Cited

U.S. PATENT DOCUMENTS

| 5,148,077 A | | 9/1992 | Grawey et al. |
| 5,549,926 A | * | 8/1996 | Miyamoto ............. 29/25.35 X |
| 5,593,721 A | * | 1/1997 | Daidai et al. .......... 29/25.35 X |

FOREIGN PATENT DOCUMENTS

| JP | 59-33918 | * | 2/1984 | ................. 29/25.35 |
| JP | 61-199921 | | 12/1986 | |
| JP | 62-142408 | | 6/1987 | |
| JP | 2-309807 | * | 12/1990 | ................. 310/340 |
| JP | 3-39921 | | 4/1991 | |
| JP | 3-92820 | | 9/1991 | |
| JP | 5-308237 | | 11/1993 | |

* cited by examiner

Primary Examiner—A. Dexter Tugbang
(74) Attorney, Agent, or Firm—Keating & Bennett, LLP

(57) ABSTRACT

A method of manufacturing a piezoelectric component includes forming an unhardened first elastic material partially on at least a pair of end portions of a piezoelectric element, the pair of end portions including an edge portion of the piezoelectric element, hardening the first elastic material, forming an unhardened second elastic material on the entire circumference of the piezoelectric element and the first elastic material, hardening the second elastic material, forming an unhardened outer-cladding resin on the entire circumference of the second elastic material covering the piezoelectric element and the first elastic material, and hardening the outer-cladding resin.

8 Claims, 4 Drawing Sheets

METHOD OF MANUFACTURING PIEZOELECTRIC COMPONENT

This Application is a Divisional Application of U.S. patent application Ser. No. 09/412,204, filed on Oct. 5, 1999, now U.S. Pat. No. 6,344,706.

BACKGROUND OF THE INVENTION

1. Field of the Invention

The present invention relates to a piezoelectric component and a method of manufacturing the piezoelectric component. In the piezoelectric component, a periphery of a piezoelectric element is covered by an elastic material, and the circumference of the elastic material and the piezoelectric element is covered by an outer-cladding resin.

2. Description of the Related Art

Japanese Unexamined Patent Publication No. 1-228310 describes a piezoelectric component in which a periphery of a piezoelectric element having end electrodes connected to lead terminals is covered by an elastic material such as a silicone rubber, and the circumference thereof is sealed by an outer-cladding resin.

In order to manufacture such a piezoelectric component, first, a lead terminal is attached to a piezoelectric element. Then, a silicone rubber layer is provided on the piezoelectric element by the dipping the piezoelectric element in a liquid-state silicone rubber and hardening the rubber layer by applying heat. Further, an epoxy resin layer is provided on the exterior of the silicone rubber via a dipping method. Then, the epoxy resin is hardened by heat to obtain an outer-cladding resin.

The epoxy resin used for forming the outer-cladding resin layer contracts when it is hardened by heat, and thereby a stress caused by the outer-cladding resin which contracts and compresses the interior of the piezoelectric component is generated. If the amount of stress which contracts and compresses the piezoelectric element in the piezoelectric component changes, the oscillation characteristics thereof change. The silicone rubber is used because it is able to prevent the change of the oscillation characteristics of the piezoelectric element, and has a damping effect which suppresses the waveform distortion of the piezoelectric element.

To reduce the stress generated in the piezoelectric element by the outer-cladding resin, preferably, the difference between the edge portion of the piezoelectric element and the outer-cladding resin i.e., the minimum thickness of the silicone rubber, is larger than the contraction amount of the outer-cladding resin when it is hardened, and further, is larger than the difference between the thermal expansions of the outer-cladding resin and of the piezoelectric element.

However, the dipping method for forming the liquid-state silicone rubber was not satisfactory for obtaining a required thickness of the silicone rubber at the end portions of the piezoelectric element, because of the surface tension of the silicone rubber. Therefore, the temperature characteristics of the piezoelectric components are largely varied by the stress generated in the piezoelectric element by the outer-cladding resin.

SUMMARY OF THE INVENTION

To overcome the above described problems, preferred embodiments of the present invention provide a piezoelectric component and a method of manufacturing the piezoelectric component, which greatly reduces the stress generated in the piezoelectric element by the outer-cladding resin while the function of damping the piezoelectric element is maintained.

One preferred embodiment of the present invention provides a piezoelectric component, including a substantially rectangular shaped piezoelectric element, a first elastic material covering at least a pair of end portions of the piezoelectric element, the pair of end portions including edge parts of the piezoelectric element, a second elastic material covering the entire piezoelectric element and the first elastic material, and an outer-cladding resin covering the whole circumference of the piezoelectric element covered with the second elastic material.

In the above described piezoelectric component, the end portions of the piezoelectric element, where it is most difficult to obtain a sufficient thickness of an elastic material, is covered by the first elastic material. Further, the periphery of the first elastic material is covered by the second elastic material. That is, two elastic materials are provided at the edge parts of the piezoelectric element, where the piezoelectric element is most easily affected by the contraction stress imparted by the outer-cladding resin. Therefore, even when the contraction stress imparted by the outer-cladding resin varies according to temperature changes, a change in oscillation characteristics caused by the change of temperature is prevented because the first and second elastic materials having sufficient thickness absorb any changes of stress. Further, the damping effect is maintained by the second elastic material to thereby prevent a waveform distortion or other harmful effects from being generated.

The modulus of elasticity and the hardness of the first and second elastic materials are determined in accordance with respective required characteristics. In the case of the second elastic material. For example, it is preferable to set the hardness equal to or less than 28 in "Shore Hardness A."

Another preferred embodiment of the present invention provides a method of manufacturing a piezoelectric component, including the steps of forming an unhardened first elastic material partially on at least a pair of end portions of a piezoelectric element, the pair of end portions including edge parts of the piezoelectric element, then hardening the first elastic material, forming an unhardened second elastic material on the entire circumference of the piezoelectric element and the first elastic material, then hardening the second elastic material and forming an unhardened outer-cladding resin on the entire circumference of the second elastic material covering the piezoelectric element and the first elastic material, then hardening the outer-cladding resin.

By the above described method, the piezoelectric component according to preferred embodiments of the present invention can be manufactured easily.

For forming the unhardened first and second elastic materials, not only a dipping method but also using a soldering iron, dispenser, or other suitable method can be utilized. Similarly, a dipping method or other methods can be utilized for forming the unhardened outer-cladding resin.

Although the first elastic material and the second elastic material may be the same, it is preferable to make the thixotropic index (call it a thixo index hereafter) of the first elastic material larger than the thixo index of the second elastic material. The thixotropic property is one of the characteristics of fluid, and is defined as a property in which a viscosity varies nonlinearly depending on a shearing stress. It is easy to achieve sufficient thickness of the elastic material when forming the elastic material on the piezoelectric element if the thixo index of the elastic material is large. Therefore, if the thixo index of the first unhardened elastic material is made larger than the thixo index of the second unhardened elastic material, sufficient film thickness at the both edge parts of the piezoelectric element can be obtained. On the other hand, there is no problem even when the thixo index of the second elastic material is small, because it is easy to coat the center portion of the piezoelectric element using the second elastic material, and this construction is hardly affected by heat.

Preferably, the thixo index of the first and second elastic material is preferably larger than about 1.7. If the thixo index is equal to or less than about 1.7, it is hard to achieve a sufficient thickness of the elastic material at the end portions of the piezoelectric element because of a surface tension of the elastic material.

Other features and advantages of the present invention will become apparent from the following description of the invention which refers to the accompanying drawings.

DETAILED DESCRIPTION OF PREFERRED EMBODIMENTS

Figure 1:
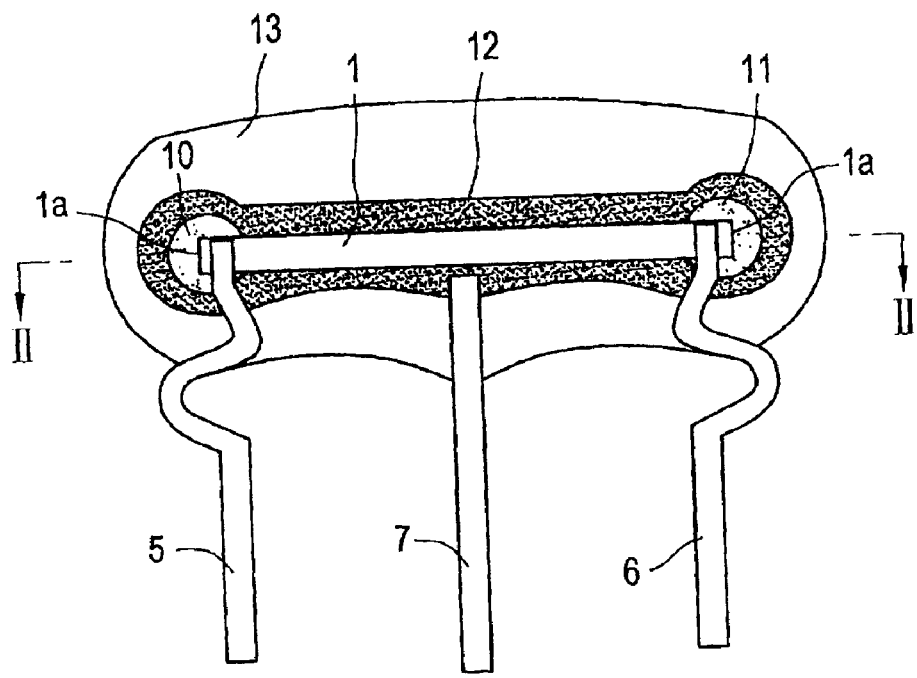
FIG. 1 is a longitudinal sectional view of one preferred embodiment of a piezoelectric component according to the present invention.
Figure 2:
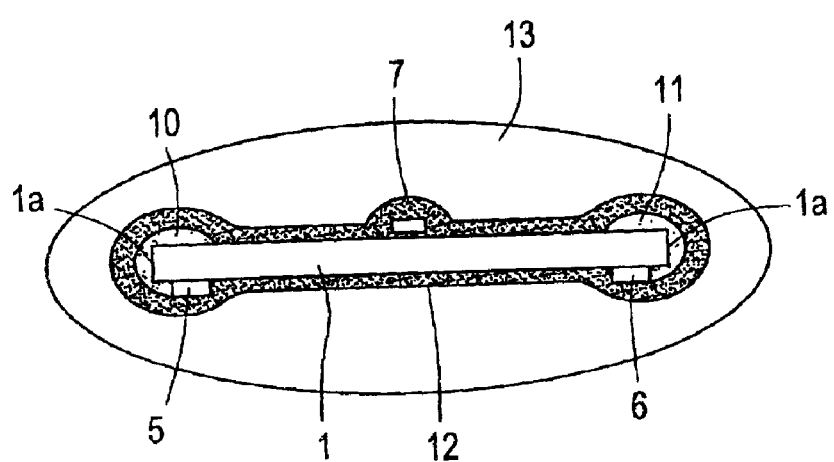
FIG. 2 is a sectional view of FIG. 1 taken along the line II—II in FIG. 1.
Figure 3:
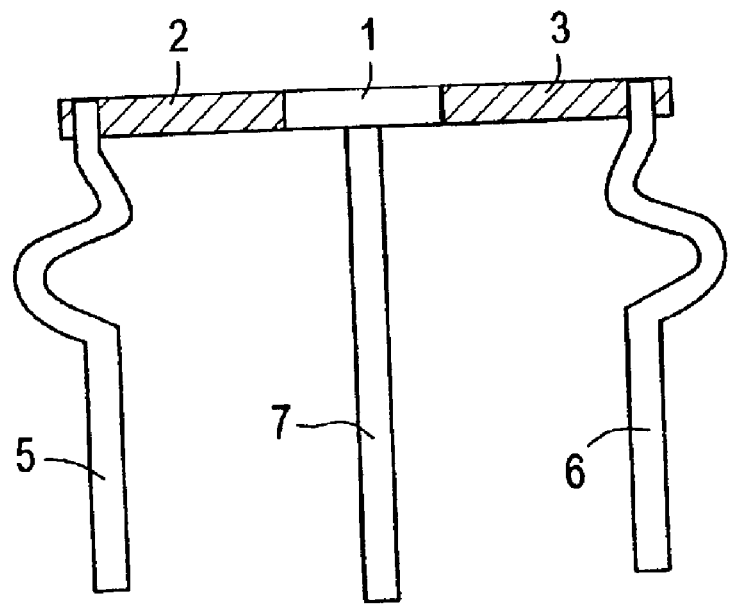
FIG. 3 is a front view of the piezoelectric element shown in FIG. 1 with which lead terminals are fixed.
Figure 4:
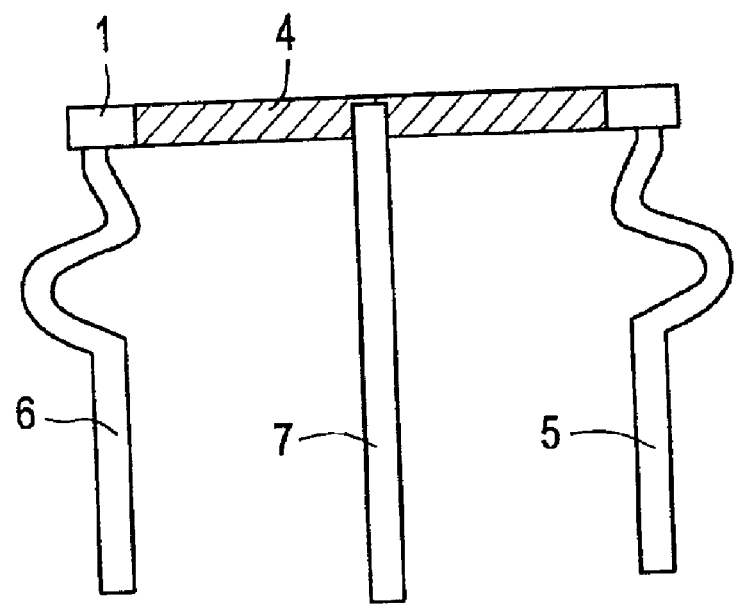
FIG. 4 is a back view of the piezoelectric element shown in FIG. 1 with which lead terminals are fixed.

FIGS. 1 to 6 shows a three terminal type piezoelectric trap component which is one preferred embodiment of a piezoelectric component according to the present invention. This piezoelectric trap component preferably includes a substantially rectangular shaped piezoelectric-ceramic substrate 1 which has a pair of substantially rectangular major surfaces. The substrate 1 is polarized along the longitudinal direction of the major surfaces thereof. As shown in FIG. 3 and FIG. 4, the divided electrodes 2 and 3 are disposed on both end portions of a first of the major surfaces of the piezoelectric-ceramic substrate 1. The ground electrode 4 is disposed at the approximate center portion of a second major surface of the piezoelectric-ceramic substrate 1. The divided electrodes 2 and 3 and the ground electrode 4 are partially overlapping each other with the piezoelectric-ceramic substrate 1 disposed therebetween. A thickness shear vibration is generated at the opposite portion. The piezoelectric element of a preferred embodiment of the present invention is preferably constituted by the piezoelectric-ceramic substrate 1 provided with the above described electrodes 2–4. Lead terminals 5 and 6 are respectively fixed and connected to the divided electrodes 2 and 3 via soldering or other suitable joining process or member. A lead terminal 7 is fixed and connected to the ground electrode 4. The lead terminals 5–7 are preferably defined by plate-shaped or wire-shaped metallic material.

Edge portions of the piezoelectric-ceramic substrate 1 are respectively covered by silicone rubber layers 10 and 11 which define the first elastic material 1. The thixo indexes of the silicone rubber 10 and 11 in an unhardened state are preferably larger than about 1.7 to achieve sufficient thickness of the first elastic material at the edge portions of the piezoelectric-ceramic substrate 1.

The entire periphery of the piezoelectric-ceramic substrate 1 with the silicone rubber layers 10 and 11 is preferably covered with a silicone rubber 12 which defines a second elastic material.

Since this silicone rubber 12 covers the vibrating portion of the piezoelectric element, it is necessary to select a material property in consideration of the piezoelectric property in addition to the thixotropic property in an unhardened state. In this preferred embodiment, the thixo index of the second silicone rubber 12 is preferably larger than about 1.7, although it is preferably smaller than the thixo index of the silicone rubber layers 10 and 11. Moreover, in the case of a piezoelectric trap component, in order to prevent the deterioration of the piezoelectric property, it is preferable to make the hardness of the second silicone rubber 12 equal to or less than about 28 in "Shore Hardness A".

It is noted that the thixo index used here means a ratio of a viscosity at about 6 rpm and a viscosity at about 60 rpm i.e., the thixo index (Ti)=a viscosity at about 6 rpm/a viscosity at about 60 rpm.

The entire periphery of the piezoelectric-ceramic substrate 1 with the silicone rubber 12 is covered via an outer-cladding resin 13. In order to secure an electric insulation, mounting strength, and other desired characteristics, an epoxy resin is preferably used for defining the outer-cladding resin 13, for example.

Figure 5:
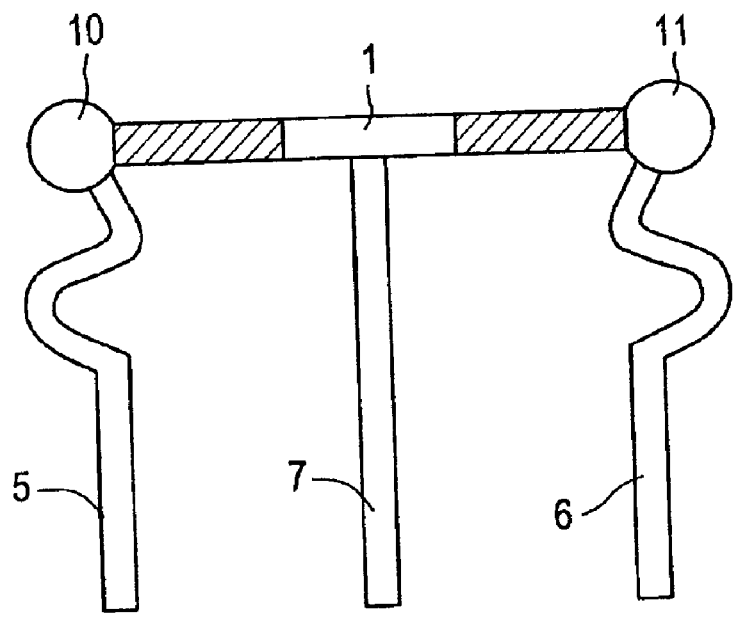
FIG. 5 is a front view of the piezoelectric element with the lead terminals shown in FIG. 3, wherein a first elastic material is further provided at the edge parts of the piezoelectric element.

A preferred embodiment of a method of manufacturing the above described piezoelectric trap is explained below. First, a piezoelectric element 1 as shown in FIG. 3 and FIG. 4 is prepared. That is, the lead terminals 5–7 are respectively fixed and connected to the electrodes 2, 3, and 4 respectively disposed on a pair of major surfaces of the piezoelectric-ceramic substrate 1. Next, as shown in FIG. 5, the first silicone rubber 10 and 11 in a fluid state i.e., an unhardened state, is partially provided so that the end portions of the piezoelectric element 1, especially the edge portions of the piezoelectric element 1 are covered. More specifically, the silicone rubber 10 and 11 in the fluid state is provided on the edge portions of the piezoelectric element 1 via iron, etc., then the silicone rubber layers 10 and 11 are hardened.

Figure 6:
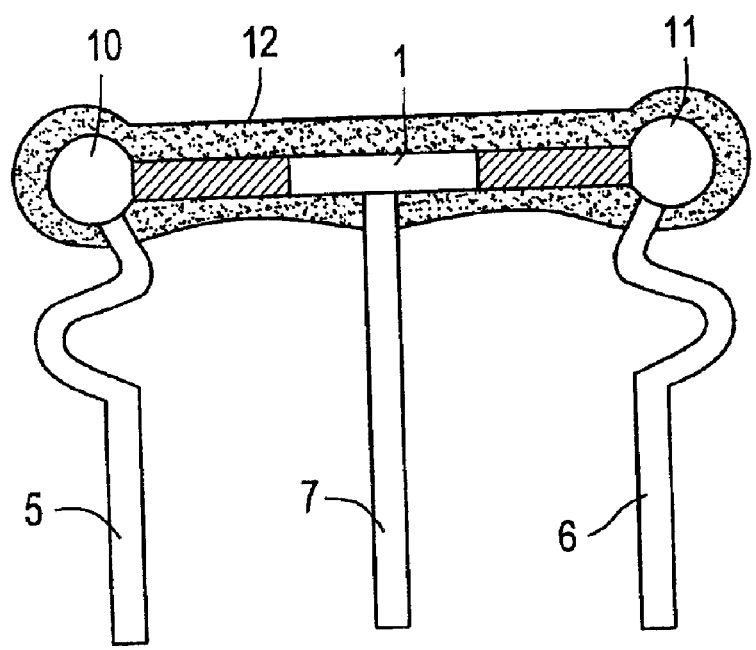
FIG. 6 is a front view of the piezoelectric element with the lead terminals and the first elastic material shown in FIG. 5, wherein a second elastic material is further provided on the entire surface of the piezoelectric element and the first elastic material.

Next, as shown in FIG. 6, a second silicone rubber 12 in a fluid state is provided on the entire surface of the piezoelectric element 1 and then the second silicone rubber 12 is hardened. This process is performed preferably by dipping the piezoelectric element 1 into the second silicone rubber 12 in the fluid state i.e., an unhardened state. To facilitate the dipping process, the second silicone rubber 12 may be diluted with xylene, or other suitable material or substance.

Next, the piezoelectric element 1 including the second silicone rubber 12 is dipped into an outer-cladding resin 13 in a fluid state i.e., an unhardened state. Then, the outer-cladding resin 13 covering the piezoelectric element 1 and the second silicone rubber 12 is hardened via heating. As a result, the piezoelectric trap shown in FIGS. 1 and 2 is obtained.

For obtaining a stable piezoelectric property, preferably, the total thickness of the silicone rubber layers 10, 11 and 12 at the edge portion 1a of the piezoelectric element 1 is larger than the difference between the maximum contraction amount of the outer-cladding resin 13 and the maximum contraction amount of the piezoelectric element 1. The preferable thickness can be easily obtained by forming the silicone rubber layers 10, 11 and 12 as described above.

Table 1 shows the relationship between a thixotropic index Ti of a silicone rubber in a fluid state and a mean thickness of the silicone rubber layer at the edge portion of a piezoelectric element.

As apparent from Table 1, the thixotropic index Ti is preferably larger than about 1.7 in order to achieve a predetermined thickness. If the thixotropic index Ti is about 1.7 or less, the silicone rubber can not be disposed at the edge portion of a piezoelectric element.

TABLE 1

| Thixotropic index Ti | Mean thickness of Silicone rubber at the edge portion of a piezoelectric element |
|---|---|
| 3.1 | 54.1 |
| 2.8 | 52.9 |
| 2.5 | 50.8 |
| 2.3 | 42.7 |
| 2.1 | 29.5 |
| 1.8 | 8.0 |
| 1.7 | 0 |

Figure 7:
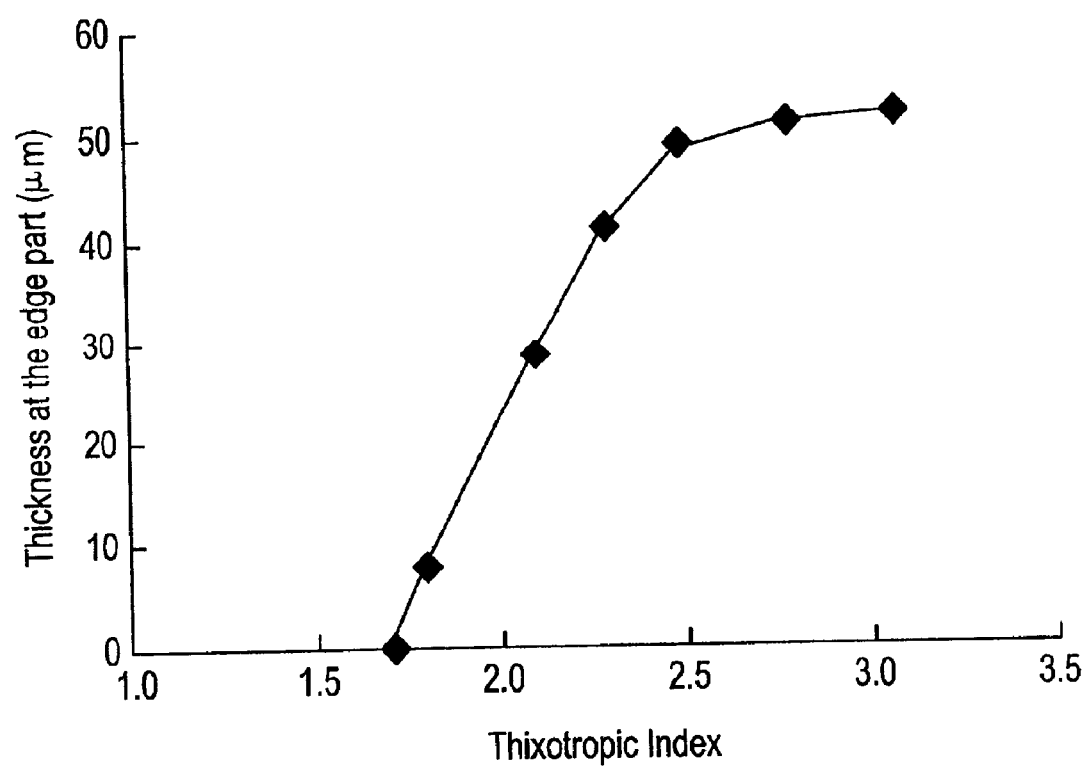
FIG. 7 is a graph showing the relationship between a thixotropic index and a thickness of the elastic material at the edge portion of the piezoelectric element.

FIG. 7 is a graph showing the relationship indicated in Table 1.

Table 2 shows the relationship between a thickness of a silicone rubber at the edge portion of a piezoelectric element and a Fo temperature characteristic of a piezoelectric trap component. The Fo temperature characteristic is determined by measuring the Fo temperature of the piezoelectric trap component within a range of about −20 degrees centigrade and about +85 degrees centigrade and then calculating the changing ratio based on Fo temperature at about +20 degrees centigrade.

As apparent from the results, the standard value of the Fo temperature i.e., ±0.5%, is satisfied when the thickness of the silicone rubber at the edge portion of the piezoelectric element is substantially equal to or larger than about 5 micrometers. If a silicone rubber in a fluid state having a thixo index Ti that is larger than about 1.7 is used, it is easy to achieve a silicone rubber layer at the edge portion of a piezoelectric element having a thickness which is substantially equal to or larger than about 5 micrometers.

TABLE 2

| Thickness | Fo changing ratio at each temperature (%) | | | | | |
|---|---|---|---|---|---|---|
| (micrometer) | −20° C. | 0° C. | +20° C. | +40° C. | +60° C. | +85° C. |
| 0 | 0.28 | 0.18 | 0.00 | −0.24 | −0.68 | −0.79 |
| 5 | 0.03 | 0.02 | 0.00 | −0.05 | −0.14 | −0.16 |
| 8 | −0.05 | −0.02 | 0.00 | −0.04 | −0.18 | −0.20 |
| 15 | −0.08 | −0.03 | 0.00 | −0.03 | −0.11 | −0.12 |

The present invention is not limited to the above described preferred embodiments. As a piezoelectric element, the present invention is not limited to a piezoelectric trap component but may be a piezoelectric filter such as one disclosed in Unexamined Japanese Patent Publication No. 1-228310, a ceramic discriminator, or other suitable apparatus.

The number of terminals may be two or three.

It is possible to use the same silicone rubber for forming the first elastic material and the second elastic material.

As a method for providing the first elastic material, in addition to dropping by an iron or a dispenser, dipping the edge portion of the piezoelectric element into the first elastic material in a fluid state is also possible. Further, as a method for providing the second elastic material, other methods can be applicable in addition to the dipping method.

Further, a material other than silicone rubber is also applicable for the elastic materials if such material has required characteristic.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a piezoelectric component, comprising the steps of:

forming an unhardened first elastic material partially on at least a pair of end portions of a piezoelectric element, the pair of end portions including an edge portion of the piezoelectric element;

hardening the first elastic material;

forming an unhardened second elastic material on an entire circumference of the piezoelectric element and the first elastic material;

hardening the second elastic material; and forming an unhardened outer-cladding resin on the entire circumference of the second elastic material covering the piezoelectric element and the first elastic material; and hardening the outer-cladding resin; wherein the total thickness of first and second elastic materials at the edge portions of the piezoelectric element is larger than a difference between the maximum contraction amount of the outer-cladding resin and a maximum contraction amount of the piezoelectric element.

2. The method according to claim 1, wherein a thixotropic index of the unhardened first elastic material is larger than that of the unhardened second elastic material.

3. The method according to claim 2, wherein thixotropic indexes of the unhardened first elastic material and the unhardened second elastic material are respectively larger than about 1.7.

4. The method according to claim 1, wherein thixotropic indexes of the unhardened first elastic material and the unhardened second elastic material are respectively larger than about 1.7.

5. The method according to claim 1, wherein at least one of the first elastic material and the second elastic material is silicone rubber.

6. The method according to claim 1, wherein the step of forming the first elastic material is performed by one of dropping the first elastic material by one of an iron and a dispensers and dipping the edge portion of the piezoelectric element into the first elastic material in a fluid state.

7. The method according to claim 1, wherein the step of forming the second elastic material is performed by dipping the piezoelectric element into the second elastic material in a fluid state.

8. The method according to claim 1, wherein the step of forming the outer-cladding resin is performed by dipping the piezoelectric element into the outer-cladding resin in a fluid state.

* * * * *